United States Patent
Dishongh et al.

(10) Patent No.: US 6,624,643 B2
(45) Date of Patent: Sep. 23, 2003

(54) APPARATUS AND METHOD TO READ OUTPUT INFORMATION FROM A BACKSIDE OF A SILICON DEVICE

(75) Inventors: Terrence J. Dishongh, Hillsboro, OR (US); Prateek Dujari, Portland, OR (US); Bin C. Lian, Portland, OR (US); Damion T. Searls, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 117 days.

(21) Appl. No.: 09/733,461

(22) Filed: Dec. 8, 2000

(65) Prior Publication Data

US 2002/0070739 A1 Jun. 13, 2002

(51) Int. Cl.[7] .................... G01R 31/302; G01R 31/02
(52) U.S. Cl. .................... 324/752; 324/750; 324/755
(58) Field of Search ................... 324/750–758, 324/765; 438/14, 17–18, 16, 122, 124, 126, 127; 250/234, 286, 306

(56) References Cited

U.S. PATENT DOCUMENTS

| 5,334,540 | A | * | 8/1994 | Ishii | 324/765 |
|---|---|---|---|---|---|
| 5,493,236 | A | * | 2/1996 | Ishii et al. | 324/752 |
| 5,698,474 | A | * | 12/1997 | Hurley | 437/209 |
| 5,783,835 | A | * | 7/1998 | Hollman et al. | 250/559.46 |
| 5,930,588 | A | * | 7/1999 | Paniccia | 438/14 |
| 5,959,461 | A | * | 9/1999 | Brown et al. | 324/765 |
| 6,020,746 | A | * | 2/2000 | Livengood | 324/754 |
| 6,144,213 | A | * | 11/2000 | Johnson | 324/754 |
| 6,159,754 | A | * | 12/2000 | Li et al. | 438/14 |
| 6,251,706 | B1 | * | 6/2001 | Paniccia | 438/122 |
| 6,261,870 | B1 | * | 7/2001 | Haehn et al. | 438/124 |
| 6,329,212 | B1 | * | 12/2001 | Dobrovolski | 438/14 |
| 6,335,629 | B1 | * | 1/2002 | Lee et al. | 324/752 |
| 6,375,347 | B1 | * | 4/2002 | Bruce et al. | 438/17 |

* cited by examiner

Primary Examiner—Kamand Cuneo
Assistant Examiner—Jermele Hollington
(74) Attorney, Agent, or Firm—Blakely, Sokoloff, Taylor & Zafman LLP

(57) ABSTRACT

Photon emissions from a backside of a silicon device or integrated circuit are detected. The photon emissions can be used for a technique to read output information from the silicon device, as the photon emissions from part of an output signal path for the silicon device. The emitted photons pass through openings of a mask positioned over the backside of the silicon device, and are detected by a photodetector array. Electrical signals are generated from the detected photons, and can be converted to optical signals for subsequent transmission from optical transmitters coupled to the photodetector.

29 Claims, 3 Drawing Sheets

US 6,624,643 B2

APPARATUS AND METHOD TO READ OUTPUT INFORMATION FROM A BACKSIDE OF A SILICON DEVICE

BACKGROUND OF THE INVENTION

1. Field of the Invention

The present invention relates generally to silicon devices and integrated circuits, and in particular but not exclusively, relates to reading output information from a backside of a silicon device.

2. Background Information

Communication from a silicon device or integrated circuit to external components on a motherboard is typically done via use of electrical connections between the silicon and a substrate material. Examples of such electrical connections include wire bonding and controlled collapse chip carrier (C4) connections.

In instances where faster communication from the silicon device to the motherboard is needed, directed chip attachment (DCA) technology has been considered. Unfortunately, DCA technology has serious reliability issues with regards to thermal mismatches and production/inventory control.

With the ever-increasing need for high-speed applications, such as those beyond 2.5 Gbits/second, the above-mentioned electrical connections and DCA connections face severe limitations due to thermal dissipation, skin effect attenuation, jitter and noise issues, etc. Such limitations significantly degrade signal and performance characteristics associated with communication between silicon devices and external components, particularly when reading output information/signals from the silicon devices.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of an apparatus and method to read output information from a backside of a silicon device are described herein. In the following description, numerous specific details are provided, such as various mounting and connection components in FIGS. 2–6, to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As an overview, an embodiment of the invention detects photon emissions from a backside of a silicon device or integrated circuit, with the photon emissions forming part of an output signal path from the integrated circuit. The photon emissions are detected by a photodetector array, which in one embodiment comprises a photodiode array, and then signals representing the photon emissions (and their underlying information) can be sent by optical transmitters to optical receivers for subsequent processing.

Figure 1:
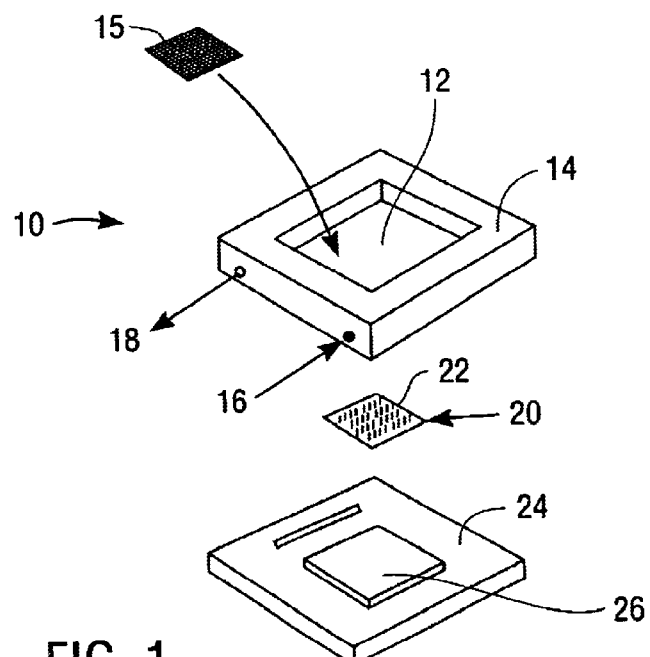
FIG. 1 is an exploded view of an embodiment of the present invention.

Referring first to FIG. 1, shown generally at 10 is an exploded view of an assembly according to one embodiment of the invention. The assembly 10 includes a photodetector array 12 fused to a cooling block 14. An example of the photodetector array 12 that can be used by an embodiment of the invention is an indium gallium arsenide (InGaAs) PIN photodiode array. In another embodiment photodetectors such as for example an array of charge coupled devices 15 can be used. It is understood that other suitable photodetectors such as for example phototransistors may also be used.

The cooling block 14 is used for thermal cooling of the various components of the assembly 10, and can be made of aluminum or copper material, for example. The cooling block 14 has through-holes or input route(s) 16 and output route(s) 18 for coolant fluid. The coolant fluid can comprise any number of readily available coolant fluids, such as water.

The assembly 10 further includes a mask 20, which in one embodiment is made from a carbon material. Other types of materials that may be used for the mask 20 include materials that are thermally conductive and that can act as thermal transfer element and as an electromagnetic shield. The mask 20 includes a plurality of openings or holes 22. As will be described below, the holes 22 allow photons emitted from underlying transistors to reach corresponding photodetectors of the photodetector array 12, while the remaining portions of the mask 20 prevent passage of photons emitted from non-corresponding transistors.

The assembly 10 includes an integrated circuit device 24, which may include one or more silicon devices, such as transistors that emit photons. The device 24 can be in the form of one or more die having a backside 26. An example of the device 24 is an organic land grid array (OLGA) component, and it is understood that other types of devices may be implemented by embodiments of the invention.

Figure 2:
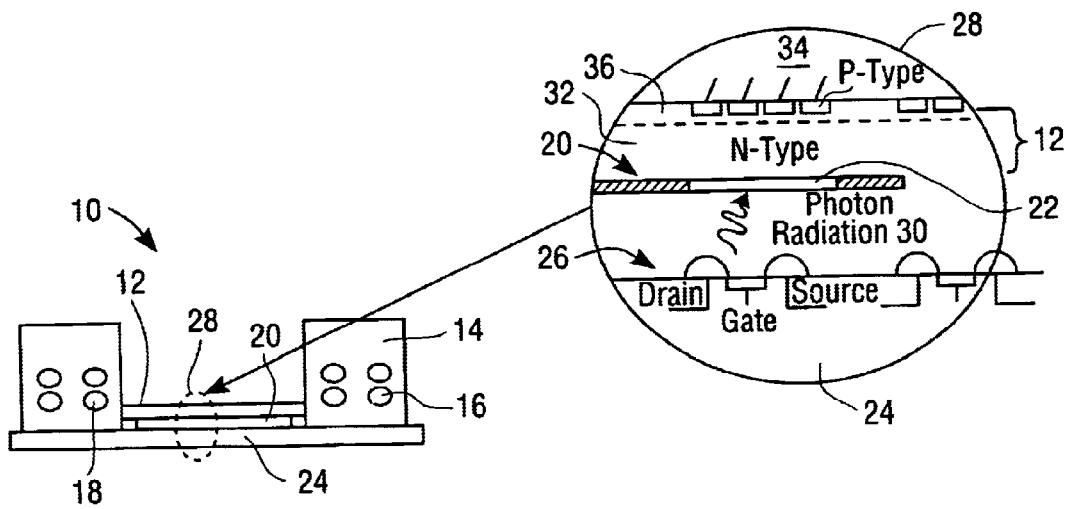
FIG. 2 is a view illustrating operation of the embodiment shown in FIG. 1.

An embodiment of the assembly 10 thus combines use of backside photon emissions with thermal cooling, thereby allowing output signals to be read from the backside 26 of the device 24 and allowing the device 24 to be cooled by the cooling block 14. FIG. 2 illustrates operation of the assembly 10 in connection with reading or detecting photon emissions from the backside 26 of the device 24. A magnified portion 28 shows interaction/operation of the various parts of the assembly 10 in more detail.

An electrical signal, such those signals that are generated during normal operation of the device 24, travels from a source of a transistor (formed in the device 24) to a drain, as a result of standard electrical fields applied to a gate of the transistor. That is, the gate allows electrons to pass from the source to the drain. As a result of this electrical transmission, photon(s) 30 move or radiate from the source towards the drain.

After the photons 30 are emitted, they travel through the holes 22 of the mask 20. An infrared-transparent fluid may be disposed in or may cover the holes 22. Examples of infrared-transparent fluids that can be used include olive oil, or Galden™ or Fomblin™ fluids manufactured by Ausimont of Italy.

After passing through the holes 22 and the infrared-transparent fluid, the photons 30 reach an N-type region 32 of the photodetector array 12. The photons 30 travel through the N-type region 32 until they are collected by a plurality of P-type receivers 34 of the photodetector array 12. Once the photons 30 reach the P-type receivers 34, the P-type receivers 34 generate an electrical current, which can be amplified by electronic circuitry (not shown) disposed on a substrate 36 of the photodetector array 12.

Operation of the assembly 10 described above with reference to FIG. 2 can occur during a testing stage during a manufacturing process of the assembly 10 (e.g., to test if the transistors in the device 24 are functioning properly) or during actual use of the assembly 10. For these operating environments, FIGS. 3 and 4 show example connections of the photodetector array 12 to exterior substrates, as well as showing examples of how the assembly 10 can be mounted to a printed circuit board (PCB) or to a motherboard.

As an initial consideration, proper alignment of the photodetector array 12 to the transistors of the device 24 can improve the accuracy of photon reception. In some situations, exact one-to-one alignment between transistors and their corresponding photodetectors may be difficult to achieve. Therefore, an embodiment of the invention places the photodetector array 12 in a general position, such that a group of photodetectors in the photodetector array 12 is dedicated to one transistor of the device 24. An example of this group of photodetectors is an array of 25 photodiodes (e.g., a 5×5 array), with all 25 photodiodes subsequently being tied to a single/same output from the photodetector array 12. Thus, it is not necessary to have exact one-to-one correlation in this embodiment. A plurality of set screws 38, shown in FIGS. 3 and 4, may be used to hold down the cooling block 14 and to move the photodetector array 12 to a general position.

Figure 3:
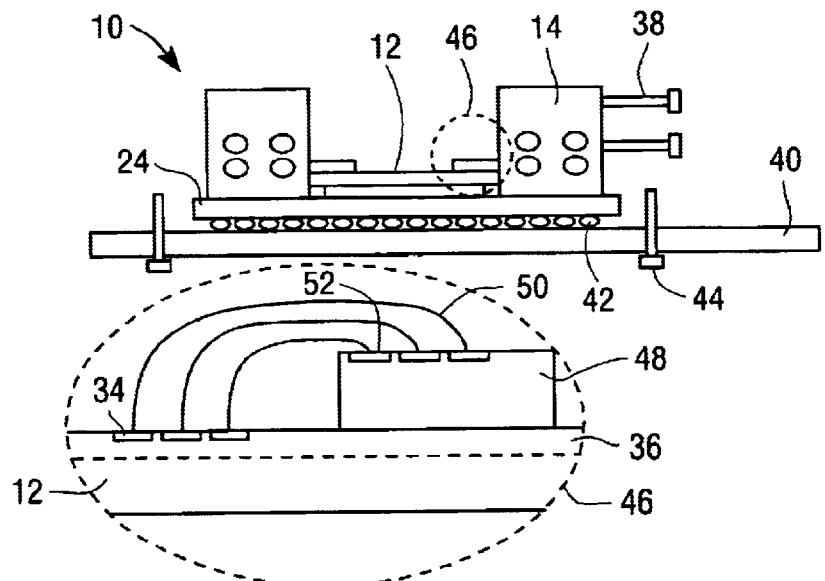
FIG. 3 is a view illustrating an example connection between a substrate and a photodetector array of the embodiment of FIGS. 1–2.
Figure 4:
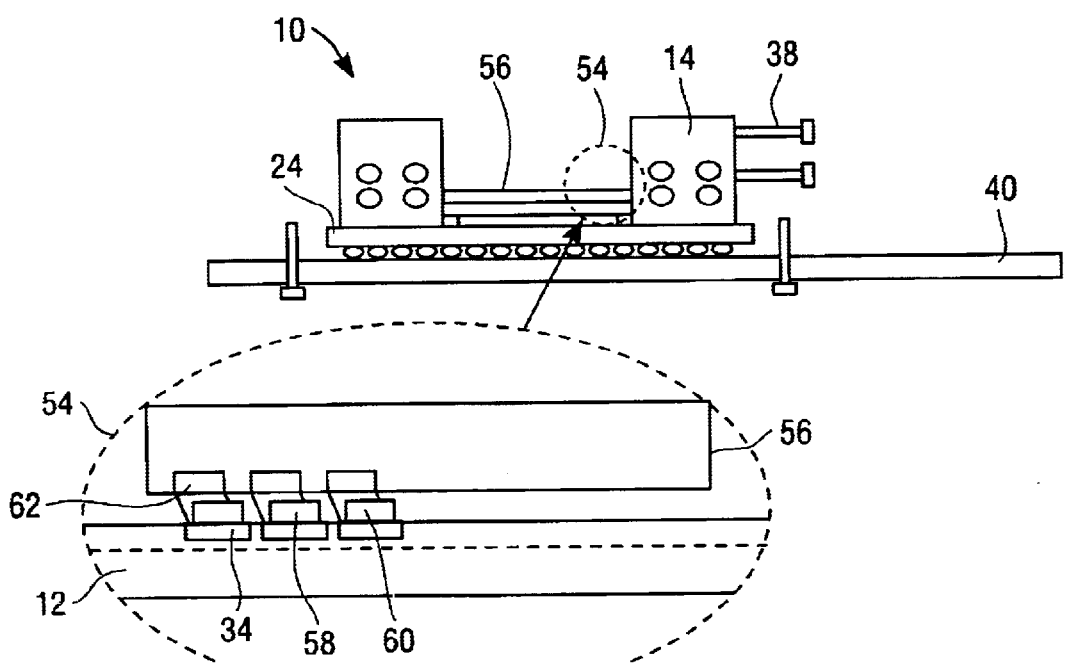
FIG. 4 is a view illustrating another example connection between a substrate and the photodetector array of the embodiment of FIGS. 1–2.

FIG. 3 shows the assembly 10 mounted to a PCB, motherboard, or other board/card 40. The assembly 10 may be mounted to the board 40 via solder joints 42, retention screws 44, or via other suitable attachment techniques. A magnified portion 46 illustrates an embodiment of a connection technique to connect the photodetector array 12 to an exterior substrate 48. From the exterior substrate 48, electrical signals can be carried from the photodetector 12 to other devices on the board 40.

As shown by the magnified portion 46, wires 50 couple metal interconnect pads 52 of the exterior substrate 48 to the P-type receivers 34 of the photodetector array 12. In this manner, the wires 50 can carry electrical signals that represent the photons 30 detected by the photodetector array 12. Standard wire bond technology may be used to connect the wires 50 between the pads 52 and the P-type receivers 34. The wires 50 may be made from a gold material or other high-conductivity material. The photodetector array 12 (e.g., its substrate 36) may be epoxied to the exterior substrate 48 using silver epoxy or other suitable adhesive.

A magnified portion 54 in FIG. 4 illustrates an embodiment of a C4 connection technique to connect the photodetector array 12 to an exterior substrate 56. Metal portions/layers 58 are disposed over the P-type receivers 34 of the photodetector array 12. Solder joints 60 connect the metal portions 58 to metal pads 62 of the exterior substrate 56.

Figure 5:
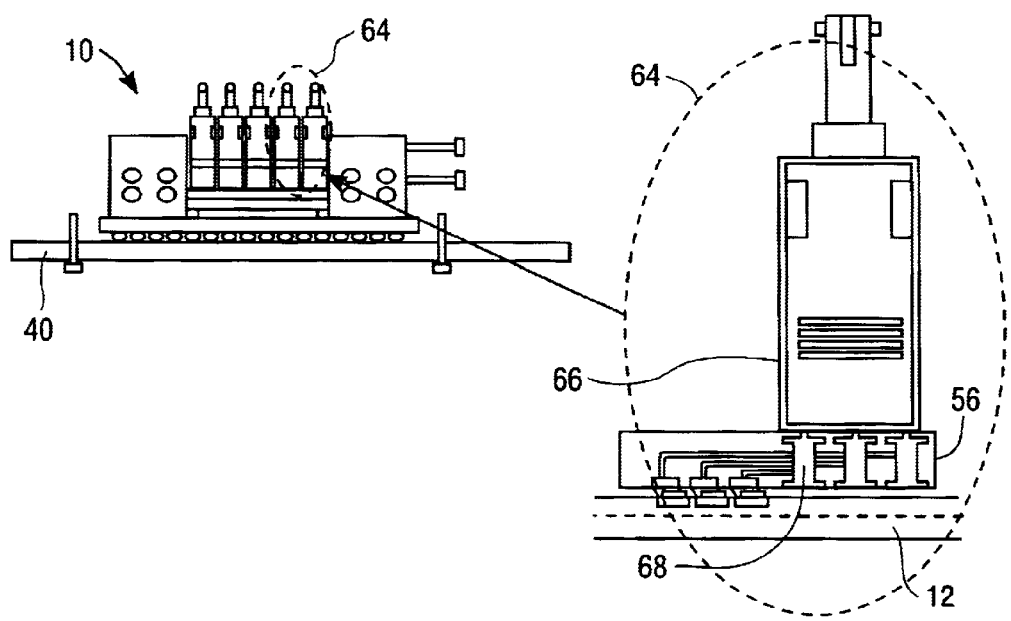
FIG. 5 is a view illustrating an example placement of optical transmitters for the connection shown in FIG. 4.

Shown next in a magnified portion 64 in FIG. 5 is an example placement of one or more optical transmitters 66 for the C4 connection embodiment of FIG. 4. The optical transmitters 66 can comprise fiber optic transmitters such as those that are commercially available. The optical transmitters 66 are placed over the exterior substrate 56, and are coupled to receive the electrical signals from the photodetector array 12 and to convert the received electrical signals into optical signals for transmission to other devices on the board 40. Through-holes 68 may be made in the exterior substrate 56 for mounting the optical transmitters 66 and for routing interconnection paths.

Figure 6:
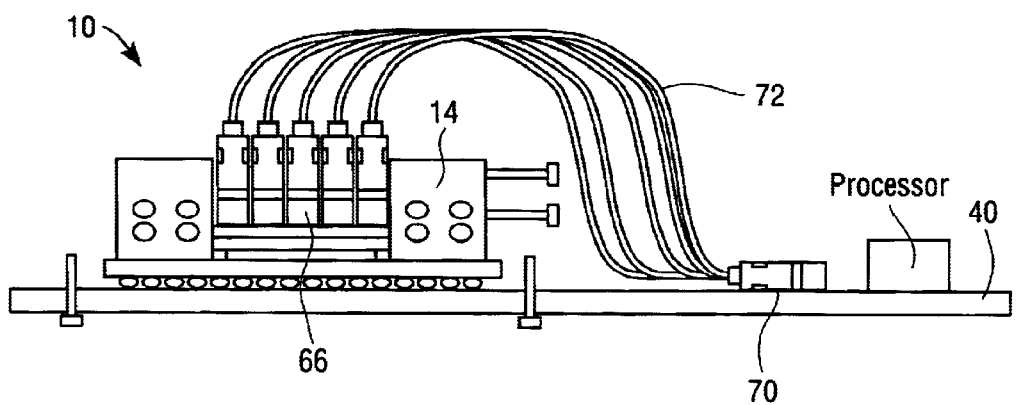
FIG. 6 is a view illustrating an example connection of optical receivers to the optical transmitters of FIG. 5.

FIG. 6 illustrates connection of optical receivers 70 to the optical transmitters 66, via fiber optic cables 72. The optical receivers 70 can be coupled to devices, such as a processor, on the board 40 that process the information read from the backside 26 of the device 24. The fiber optic cables 72 provide flexibility that allows them to extend over the cooling block 14 and to make interconnections to the optical receivers 70 without interference.

In conclusion, an embodiment of the invention is able to read information from the backside 26 of the device 24 by detecting photon emissions. Such an embodiment effectively utilizes these photon emissions, as compared to existing systems that do not use the photon emissions and thus "waste" information. Use of the photon emissions as a technique to read output information is useful in silicon processor and memory technology that use large numbers of input/output. Furthermore, use of the cooling block 14, in combination with the reading of photon emissions, address heat and power dissipation requirements that are associated with higher levels of input and output of silicon devices.

Current photo-electronic systems that use optical channels to extract information from silicon devices have structures that crowd the existingly tight footprint of a C4 electronic device. One embodiment of the assembly 10 avoids this crowding by extracting information from the backside of the silicon where no input/output channels currently exist. Furthermore, this embodiment uses natural device physics to extract output information without changing a silicon process.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

For instance, FIGS. 5–6 show an example placement of the optical transmitters 66 with regards to the substrate 56 that is connected to the photodetector array 12 using C4 connection techniques. It is understood that the optical transmitters 66 can be placed on substrates that are connected to the photodetector array 12 via connection techniques that are different from C4.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
a mask having an opening positionable over a backside of a silicon device; and
an array of photodetectors, wherein a photodetector from the array is positioned over the opening of the mask to detect, through the opening, a photon emission from the backside of the silicon device and to generate an electrical signal indicative of the detected photon emission.

2. The apparatus of claim 1 wherein the photodetector comprises a photodiode.

3. The apparatus of claim 1 wherein the photodetector comprises a charge coupled device.

4. The apparatus of claim 1 wherein the silicon device comprises one of a plurality of transistors disposed on an integrated circuit, and wherein the mask includes a plurality of openings correspondingly positionable over the plurality of transistors.

5. The apparatus of claim 1 wherein the mask is made of a carbon material.

6. The apparatus of claim 1, further comprising an infrared-transparent fluid disposed to cover the opening.

7. The apparatus of claim 1 wherein groups of photodetectors in the array are correspondingly associated to individual silicon devices underlying the array, each group of photodetectors being capable to generate a common electrical signal indicative of photon emission from their corresponding silicon device.

8. The apparatus of claim 1 wherein the photodetector comprises:
an N-type region positioned over the opening of the mask; and
a plurality of P-type regions disposed over the N-type region to receive photons of the photon emission that travel through the N-type region and to generate the electrical signal from the received photons.

9. The apparatus of claim 1, further comprising an optical transmitter coupled to the photodetector to generate an optical signal from the electrical signal.

10. The apparatus of claim 1, further comprising a cooling block positioned adjacent to the photodetector array to provide thermal cooling for the silicon device and for the photodetector array.

11. The apparatus of claim 10 wherein the cooling block is made of a copper material having through-holes to carry coolant fluid.

12. The apparatus of claim 1, further comprising a substrate positioned adjacent to the photodetector and having an electrical connection to the photodetector to receive the electrical signal from the photodetector.

13. The apparatus of claim 12 wherein the electrical connection of the substrate to the photodetector comprises a wire bond connection.

14. The apparatus of claim 12 wherein the electrical connection of the substrate to the photodetector array comprises a controlled collapse chip carrier connection.

15. A method, comprising:
detecting a photon emission from a backside of a silicon device through an opening of a mask positionable over the backside of the silicon device using a photodetector in an array of photodetectors; and
generating an electrical signal from the photodetector, the electrical signal being representative of the detected photon emission.

16. The method of claim 15 wherein the photodetector positioned over the mask detects the photon emission, the method further comprising cooling the photodetector array and the silicon device with a cooling block positioned adjacent to the photodetector array.

17. The method of claim 15, further comprising transmitting the generated optical signal to a device, distanced from the silicon device, capable to process information associated with the optical signal.

18. The method of claim 15, further comprising:
detecting the photon emission from the backside of the silicon device with a group of photodetectors in the array of photodetectors; and
generating a common electrical signal from the group of photodetectors representative of the photon emission detected by the group of photodetectors.

19. The method of claim 15 wherein the photon emission is detected through an infrared-transparent fluid disposed to cover the opening of the mask.

20. A system, comprising:
an integrated circuit having a plurality of silicon devices;
a mask positioned over a backside of the integrated circuit and having a plurality of openings correspondingly positioned over the plurality of silicon devices; and
a photodetector array positioned over the mask to detect, through the openings, photon emissions from the silicon devices via the backside of the integrated circuit and to generate electrical signals indicative of the detected photon emissions.

21. The system of claim 20, further comprising a cooling block positioned adjacent to the photodetector array to provide thermal cooling for the integrated circuit and for the photodetector array.

22. The system of claim 20, further comprising a substrate positioned adjacent to the photodetector array and having an electrical connection to the photodetector array to receive the electrical signals from the photodetector array.

23. The system of claim 20, further comprising:
a plurality of optical transmitters coupled to the photodetector array to generate optical signals from the electrical signals;
a plurality of optical receivers coupled to the optical transmitters, via fiber optic cables, to receive the optical signals from the optical transmitters; and
a processor coupled to the optical receivers to process information associated with the received optical signals.

24. A method, comprising:
placing a mask having a plurality of openings over a backside of an integrated circuit;
positioning a photodetector array over the mask, the photodetector array having groups of photodetectors; and
aligning the groups of photodetectors over individual silicon devices of the integrated circuit and over corresponding openings of the mask.

25. The method of claim 24, further comprising:
connecting the photodetector array to a cooling block;
positioning the cooling block adjacent to the integrated circuit; and mounting the cooling block and integrated circuit to a board.

26. The method of claim 24, further comprising electrically connecting the photodetector array to pads of a substrate.

27. The method of claim 26 wherein electrically connecting the photodetector array to pads of the substrate comprises wire-bonding the pads to the photodetector array.

28. The method of claim 26 wherein electrically connecting the photodetector array to pads of the substrate comprises using a controlled collapse chip carrier connection.

29. The method of claim 26, further comprising coupling optical transmitters to the photodetector array.

* * * * *